HYBRID CERAMIC FILTERS HAVING TWO-TERMINAL PIEZOELECTRIC RESONATOR IN SHUNT WITH THREE-TERMINAL PIEZOELECTRIC RESONATOR TO IMPROVE HARMONIC REJECTION

Filed April 10, 1964

INVENTOR
ISAO TOYOSHIMA
BY Wenderoth, Lind & Ponack
ATTORNEYS

HYBRID CERAMIC FILTERS HAVING TWO-TERMINAL PIEZOELECTRIC RESONATOR IN SHUNT WITH THREE-TERMINAL PIEZOELECTRIC RESONATOR TO IMPROVE HARMONIC REJECTION

Filed April 10, 1964 2 Sheets-Sheet 2

INVENTOR
ISAO TOYOSHIMA

BY Wenderoth, Lind and Ponack

ATTORNEYS

United States Patent Office 3,241,092

Patented Mar. 15, 1966

3,241,092

HYBRID CERAMIC FILTERS HAVING TWO-TERMINAL PIEZOELECTRIC RESONATOR IN SHUNT WITH THREE-TERMINAL PIEZOELECTRIC RESONATOR TO IMPROVE HARMONIC REJECTION

Isao Toyoshima, Otokuni-gun, Kyoto-fu, Japan, assignor to Murata Manufacturing Co., Ltd., Otokuni-gun, Kyoto-fu, Japan Filed Apr. 10, 1964, Ser. No. 358,883
Claims priority, application Japan, Apr. 10, 1963, 38/18,833
5 Claims. (Cl. 333—72)

This invention relates to electrical ceramic wave filters and more particularly to wave filters having a plurality of ceramic bodies as mechanical resonators.

It has been known generally that lead-zirconate-titanate ceramics can be used as electrical wave filters such as intermediate frequency filters in transistorized radio receivers because they have large piezo-electric constants, excellent temperature characteristics, and dielectric constants of suitable magnitudes. In the commonly used electrical ceramic wave filters, a single body of circular or square plate vibrating in central symmetric fashion has been used.

However this ceramic resonator can vibrate in several different modes in addition to the radial mode such as bending, shearing, or edging. Moreover if the center of input or output electrodes does not coincide with the center of ceramic plate, the overtone frequencies of some vibration modes become comparable in magnitude to the fundamental frequencies of the intended modes and interfere with each other. Thus the spurious vibrations occur and cause unfavorable effects in the filter response.

In general, a plurality of ceramic bodies which have the same fundamental frequency and the different spurious frequencies are used for suppressing spurious response, but this method leads to large size and high material costs.

An object of this invention is to provide electrical ceramic filters improved in the spurious response. Another object of this invention is to provide low cost electrical ceramic filters in simple structures. The novel features of the invention, as well as the invention itself, both as to its organization and method of operation, will be apparent from the following description and from the drawing, which is intended for the purpose of illustration only, and in which:

FIGS. 1*a* and 1*b* show schematic views of split-electrode type ceramic filters consisting of a circular or square plate.

Figures 5A, 5B:
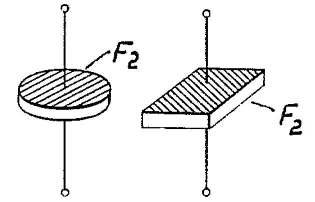

FIGS. 5*a* and 5*b* show schematic views of two-terminal ceramic filters consisting of a circular or square plate.

Figure 6:
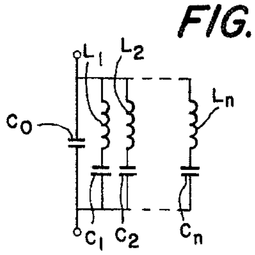

FIG. 6 shows an equivalent circuit for the filters shown in FIG. 5.

Figure 7:
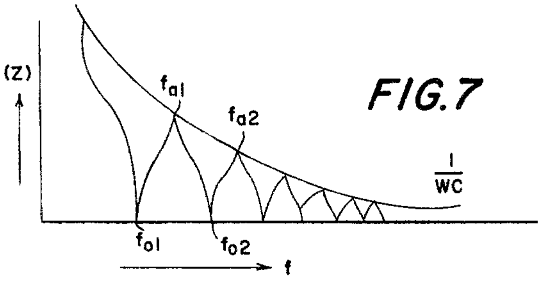

FIG. 7 shows the frequency characteristic of the impedances for the filters shown in FIG. 5.

Figure 8:
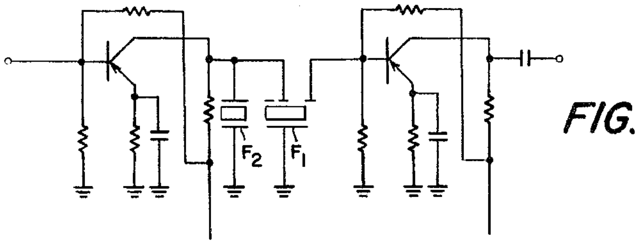

FIG. 8 is a circuit diagram of the hybrid ceramic filters according to the invention.

Figure 9:
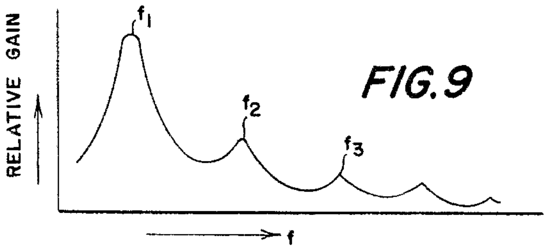

FIG. 9 is a frequency characteristic curve obtained by the arrangement of FIG. 8.

Figure 1A:
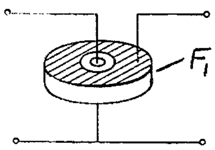
Figure 1B:
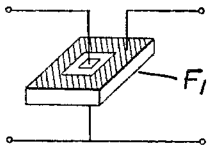
Figure 2:
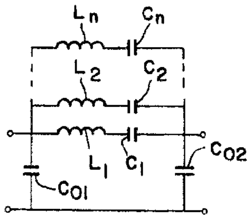
(PRIOR ART) FIG. 2
FIG. 2 shows an equivalent circuit for the filters shown in FIG. 1.

FIG. 1 shows schematically the mode of radial vibration of a circular or square ceramic plate. In practice, for the intermediate frequency of 455 kc./s., the diameter of the circular disc is about 5 mm., and the length of the square disc is about 4.5 mm., when lead-zirconate-titanate ceramics are used. If the internal loss can be disregarded, the equivalent circuit in this case may be as shown in FIG. 2, wherein $Co_1$ and $Co_2$ represent input and output capacities, respectively, and $L_1$ and $C_1$ represent the equivalent inductance and equivalent capacitance, respectively, at the fundamental resonance frequency. Thus, at the fundamental resonance frequency $f_1$ which holds a relation:

$$f_1=\frac{1}{2\pi\sqrt{L_1C_1}}$$

the impedance between input terminal and output terminal is minimized. The impedances at all are much higher than that at frequency $f_1$, and thus a filter characteristic is obtained.

In case of the mechanical oscillation system, however, the fundamental resonance always accompanies a higher harmonic resonance. In FIG. 2, therefore, $L_2$, $C_2$, $L_3$, $C_3$, . . . Ln, Cn, and so forth must be taken into consideration, in addition to $L_1$ and $C_1$. Hence, when the filter is used as an interstage connector in an ordinary way as represented by $F_1$ in FIG. 3, the frequency characteristic of the output is rich in spurious responses as indicated in FIG. 4.

The object of the invention is to overcome those difficulties by a very simple means, which consist with introducing unsplit-electrode two-terminal ceramic filters of circular or square plate as shown in FIG. 5. It is well known that the frequency characteristic of the impedance, as charted in FIG. 7, is similar to that in the former case. In FIG. 7, if $f_{on}$ represents a resonance frequency, and $f_{an}$, an antiresonance frequency, the following relations are held:

$$f_{on}=\frac{1}{2\pi\sqrt{L_nC_n}}$$

$$f_{an}=\frac{1}{2\pi\sqrt{L_n\frac{C_oC_n}{C_o+C_n}}}$$

It is also widely known that the impedance is decreased to the minimum at the resonance frequency and increased to the maximum at the antiresonance frequency.

Figure 3:
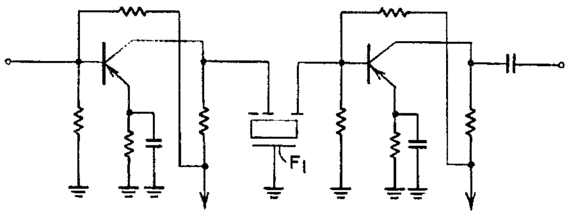
FIG. 3 (PRIOR ART)
FIG. 3 is a circuit diagram in which a split-electrode type ceramic filter shown in FIG. 1 is employed in the usual manner as an interstage connector for transistor amplifiers.
Figure 4:
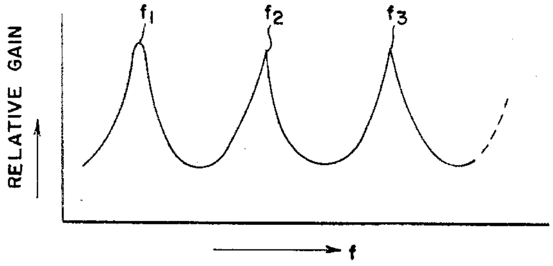
FIG. 4 (PRIOR ART)
FIG. 4 is a frequency characteristic curve obtained with the arrangement of FIG. 3.

Now, therefore, if another two-terminal filter $F_2$ is connected in parallel with $F_1$ on the input side thereof as shown in FIG. 8, and if the fundamental antiresonance frequency $f_{a1}$ of $F_2$ substantially coincides with the fundamental resonance frequency $f_1$ of $F_1$, and further if the fundamental resonance impedance of $F_2$ is set to a value sufficiently greater than that of the input impedance of $F_1$, then it is not only possible to maintain substantially the same amplification degree at said frequency as in the case of FIG. 3, but also to decrease the impedance in proportion to the increase of the frequency over the above value. Hence, even when $f_2$, $f_3$ and so forth in FIG. 4 entirely coincide with $f_{a2}$, $f_{a3}$ and so forth in FIG. 7, the resultant output is as given in FIG. 9, indicating a marked improvement in the higher harmonic spurious characteristic. Actually, these improvement effects are all the more increased because the unsplit-electrode type filter slightly differs in the condition of harmonic oscillation from the split-electrode type filter.

Thus, the spurious characteristic is improved in a very simple way. This makes it possible, for example in the case of an intermediate frequency circuit of a transistor radio receiver, to form a coil-less resistance coupling, and hence to make smaller and lower-priced radio receivers. With these features, the invention has extremely great industrial advantages.

I claim as my invention:

1. Hybrid ceramic filters comprising, in a transistorized amplification circuit wherein a split-electrode type ceramic filter is used as an interstage connector, with a two-terminal ceramic filter connected in parallel to the connector at the input side, with its antiresonance frequency being so regulated as to substantially coincide to the resonance frequency of the connector, thereby to improve the higher harmonic spurious characteristic.

2. A hybrid ceramic filter as claimed in claim 1 in which a split-electrode type ceramic filter consisting of a circular plate and a two-terminal ceramic filter consisting of a circular plate are used.

3. A hybrid ceramic filter as claimed in claim 1, in which a split-electrode type ceramic filter consisting of a square plate and a two terminal ceramic filter consisting of a square plate are used.

4. A hybrid ceramic filter as claimed in claim 1, in which a split-electrode type ceramic filter consisting of a circular plate and a two terminal ceramic filter consisting of a square plate are used.

5. A hybrid ceramic filter as claimed in claim 1, in which a split-electrode type ceramic filter consisting of a square plate and a two terminal ceramic filter consisting of a circular plate are used.

References Cited by the Examiner

UNITED STATES PATENTS 3,174,122 3/1965 Fowler -------------- 333—72

HERMAN KARL SAALBACH, *Primary Examiner.*